United States Patent
Kondo et al.

(10) Patent No.: US 6,878,441 B2
(45) Date of Patent: Apr. 12, 2005

(54) PRESSURE SENSITIVE ADHESIVE SHEET

(75) Inventors: Takeshi Kondo, Urawa (JP); Kazuhiro Takahashi, Kawaguchi (JP); Yoshihisa Mineura, Tokyo (JP)

(73) Assignee: Lintec Corporation, Tokyo (JP)

( * ) Notice: Subject to any disclaimer, the term of this patent is extended or adjusted under 35 U.S.C. 154(b) by 60 days.

(21) Appl. No.: 10/342,838

(22) Filed: Jan. 15, 2003

(65) Prior Publication Data

US 2003/0104199 A1 Jun. 5, 2003

Related U.S. Application Data

(62) Division of application No. 09/443,569, filed on Nov. 19, 1999, now Pat. No. 6,524,701.

(30) Foreign Application Priority Data

Nov. 20, 1998 (JP) ............................................ 10/331661

(51) Int. Cl.$^7$ ................................................. B32B 7/12
(52) U.S. Cl. ........................... 428/355 RA; 428/355 R; 428/343; 427/208.4; 427/208
(58) Field of Search ....................... 428/355 RA, 355 R, 428/343, 208.4, 208

(56) References Cited

U.S. PATENT DOCUMENTS 6,074,729 A    6/2000    Watanabe et al.
6,524,701 B1 *  2/2003    Kondo et al. ......... 428/355 RA

FOREIGN PATENT DOCUMENTS

JP    (1991) 3-243679      10/1991
JP    (2000) 9-33723 A      6/2000

* cited by examiner

Primary Examiner—Duc Truong
(74) Attorney, Agent, or Firm—Webb Ziesenheim Logsdon Orkin & Hanson, P.C.

(57) ABSTRACT

A pressure sensitive adhesive sheet comprising a substrate, an intermediate layer superimposed thereon and a pressure sensitive adhesive layer superimposed on the intermediate layer, characterized in that the pressure sensitive adhesive layer exhibiting an elastic modulus at 23° C. ranging from $5.0 \times 10^4$ to $1.0 \times 10^7$ Pa, the intermediate layer exhibiting an elastic modulus at 23° C. which is not greater than the elastic modulus at 23° C. of the pressure sensitive adhesive layer, or the intermediate layer exhibiting an elastic modulus at 40° C. of less than $1.0 \times 10^6$ Pa. At the time of working of the back of an adherend having a surface whose unevenness height differences are large, this pressure sensitive adhesive sheet is preferably stuck to the adherend surface to thereby protect it during the working and to enable performing the grinding at a uniform thickness without the occurrence of dimples.

4 Claims, No Drawings

PRESSURE SENSITIVE ADHESIVE SHEET

CROSS-REFERENCE TO RELATED APPLICATION

This application is a divisional of U.S. patent application Ser. No. 09/443,569 filed Nov. 19, 1999, now U.S. Pat. No. 6,524,701, entitled "Pressure Sensitive Adhesive Sheet and Method of Use Thereof", which is incorporated by reference herein.

BACKGROUND OF THE INVENTION

1. Field of the Invention

The present invention relates to a pressure sensitive adhesive sheet. More particularly, the present invention relates to a pressure sensitive adhesive sheet which, at the time of working of the back of an adherend having a surface whose unevenness (irregularity) height differences are large, is preferably stuck to the adherend surface to thereby protect it during the working.

2. Description of Related Art

In the step of grinding the back of a semiconductor wafer, the surface thereof having electrical circuits formed thereon is protected by a pressure sensitive adhesive sheet. The height differences of customary circuits attributed to electrode elements have ranged from about 5 to 20 $\mu$m. For the wafer having these customary circuits formed thereon, the conventional surface protective sheets can fully protect the circuits without the occurrence of circuit breakage or wafer cracking and thus have been satisfactory.

However, in recent years, the method of mounting IC chips has become diversified. For example, a packaging method has been developed in which an IC chip circuit surface is arranged in a downward direction. In this packaging method, electrode elements protrude from the circuit surface and the height differences thereof are 30 $\mu$m or more, occasionally greater than 100 $\mu$m. Protrudent portions formed on the surface of semiconductor wafers like those mentioned above are referred to in the art as bumps.

At least two bumps are generally formed per chip. When the number of bumps is large, the bump pitch (distance between bumps) may be hundreds of microns. Depending on bump pitch pattern and chip arrangement, there occur dense portions where the bumps gather and portions where the bump pattern is sparse. In particular, the periphery of wafers is likely to become sparse in bump portions because of the absence of chips. With respect to wafers having the pressure sensitive adhesive sheet stuck thereto, the thicknesses thereof at dense bump sites and sparse bump sites conspicuously differ. The grinding of such wafers having conspicuous thickness differences would cause a problem because the thickness differences lead to a difference in the ground wafer thickness.

When the back of a wafer carrying such bumps is subjected to grinding while the wafer surface is protected with a conventional surface protective sheet, the wafer back is ground deeply in conformity with the configuration of the bumps which forms recesses (dimples) on the back of the wafer with the result that the thickness of the wafer becomes nonuniform. Further, cracking has been encountered, which occurs from dimple portions, resulting in breakage of the wafer.

A similar cracking problem is encountered with respect to the ink marking of failure circuits (bad mark) after the inspection of the wafer circuits.

For semiconductor wafers having large bumps, preventative measures have been taken which include, for example, decreasing the hardness of the substrate film of the surface protective sheet or increasing the thickness of the pressure sensitive adhesive sheet. These measures, however, have been unsatisfactory, and the above problems have not yet been resolved.

The present invention overcomes the problems found in the prior art and provides a pressure sensitive adhesive sheet which, at the time of working of the back of an adherend having a surface whose uneven height differences are large, is preferably stuck to the adherend surface to thereby protect it during the working. In particular, the present invention provides a pressure sensitive adhesive sheet which, when the adherend is to be ground to an extremely small thickness, enables performing the grinding at a uniform thickness without the occurrence of dimples.

SUMMARY OF THE INVENTION

A first pressure sensitive adhesive sheet of the present invention comprises a substrate, an intermediate layer superimposed thereon, and a pressure sensitive adhesive layer superimposed on the intermediate layer, the above pressure sensitive adhesive layer exhibiting an elastic modulus at 23° C. ranging from $5.0 \times 10^4$ to $1.0 \times 10^7$ Pa, the above intermediate layer exhibiting an elastic modulus at 23° C. which is not greater than the elastic modulus at 23° C. of the pressure sensitive adhesive layer.

A second pressure sensitive adhesive sheet according to the present invention comprises a substrate, an intermediate layer superimposed thereon, and a pressure sensitive adhesive layer superimposed on the intermediate layer, the above intermediate layer exhibiting an elastic modulus at 40° C. of less than $1.0 \times 10^6$ Pa.

In the present invention, it is preferred that the substrate exhibit a maximum value of tan$\delta$ of dynamic viscoelasticity of at least 0.5 at a temperature ranging from −5 to 80° C.

The substrate preferably has a thickness and Young's modulus whose multiplication product is in the range of 0.5 to 100 kg/cm.

Moreover, the method of using the pressure sensitive adhesive sheet according to the present invention comprises sticking the pressure sensitive adhesive sheet to a surface of an adherend and working the adherend at its back while protecting the adherend surface by means of the pressure sensitive adhesive sheet.

Thus, the present invention provides a surface protective pressure sensitive adhesive sheet which desirably follows unevennesses formed at an adherend surface to thereby absorb uneven height differences, so that a smooth back grinding of the adherend can be performed without being influenced by the surface unevennesses and, hence, without a thickness difference. Further, the present invention provides a method of using a pressure sensitive adhesive sheet characterized by the use of this surface protective pressure sensitive adhesive sheet.

DETAILED DESCRIPTION OF THE INVENTION

The present invention will be described in greater detail below. First of all, the first pressure sensitive adhesive sheet according to the present invention will be illustrated.

The first pressure sensitive adhesive sheet of the present invention comprises a substrate, an intermediate layer, and a pressure sensitive adhesive layer arranged in this ordered array.

The pressure sensitive adhesive layer can be formed from various conventional pressure sensitive adhesives. The elastic modulus at 23° C. of the pressure sensitive adhesive layer is in the range of $5.0 \times 10^4$ to $1.0 \times 10^7$ Pa, preferably $6.0 \times 10^4$ to $5.0 \times 10^6$ Pa, and still more preferably $8.0 \times 10^4$ to $1.0 \times 10^6$ Pa. When the pressure sensitive adhesive layer is composed of an energy radiation (energy beam) curable pressure sensitive adhesive described later, the elastic modulus is that value exhibited by the pressure sensitive adhesive layer prior to the energy radiation irradiation.

When the elastic modulus at 23° C. of the pressure sensitive adhesive layer is lower than $5.0 \times 10^4$ Pa, it is likely that the pressure sensitive adhesive will ooze from the edges of the pressure sensitive adhesive sheet, or it is likely for the pressure sensitive adhesive to suffer from shearing deformation caused by the grinding force because of insufficient cohesive strength, with the result that the difference of ground wafer thickness is increased. Further, if a shear force applied to the pressure sensitive adhesive forces the adhesive into bump recesses, the danger of the pressure sensitive adhesive remaining on the wafer surface is high. On the other hand, when the elastic modulus at 23° C. of the pressure sensitive adhesive layer is higher than $1.0 \times 10^7$ Pa, the pressure sensitive adhesive layer becomes hard and its capability for following bump unevennesses is deteriorated. Consequently, problems such as an increase in the difference of ground wafer thickness and an invasion of cooling water for grinding through gaps between bumps and the pressure sensitive adhesive sheet are likely to occur.

The pressure sensitive adhesive, although not limited at all, can be selected from among, for example, rubber, acrylic, silicone and polyvinyl ether based pressure sensitive adhesives. Further, use can be made of energy radiation curable, heat foaming or water swellable pressure sensitive adhesives.

Among the energy radiation curable (energy ray curable, ultraviolet curable, electron beam curable) pressure sensitive adhesives, ultraviolet curable pressure sensitive adhesives are preferred. With respect to the water swellable pressure sensitive adhesives, for example, those disclosed in Japanese Patent Publication Nos. 5(1993)-77284 and 6(1994)-101455 are preferably used.

The energy radiation curable pressure sensitive adhesive generally contains an acrylic pressure sensitive adhesive and an energy radiation polymerizable compound as main components.

For example, low-molecular-weight compounds having in the molecule thereof at least two photopolymerizable carbon to carbon double bonds that can be converted into a three-dimensional network structure by light irradiation as disclosed in Japanese Patent Laid-open Publication Nos. 60(1985)-196,956 and 60(1985)-223,139 are widely used as the energy radiation polymerizable compounds to be incorporated in the energy radiation curable pressure sensitive adhesives. Specific examples thereof include trimethylolpropane triacrylate, tetramethylolmethane tetraacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate and commercially available oligoester acrylates.

Furthermore, in addition to the above acrylate compounds, urethane acrylate oligomers can be used as the energy radiation polymerizable compounds. Urethane acrylate oligomers can be obtained by reacting a polyester or polyether-type polyol compound with a polyisocyanate compound such as 2,4-tolylene diisocyanate, 2,6-tolylene diisocyanate, 1,3-xylylene diisocyanate, 1,4-xylylene diisocyanate or diphenylmethane-4,4-diisocyanate to thereby obtain an isocyanate terminated urethane prepolymer and by reacting the obtained isocyanate terminated urethane prepolymer with a hydroxyl group containing acrylate or methacrylate, such as 2-hydroxyethyl acrylate, 2-hydroxyethyl methacrylate, 2-hydroxypropyl acrylate, 2-hydroxypropyl methacrylate, polyethylene glycol acrylate or polyethylene glycol methacrylate.

With respect to the blending ratio of energy radiation polymerizable compound to acrylic pressure sensitive adhesive in the energy radiation curable pressure sensitive adhesive, it is preferred that 50 to 200 parts by weight, more preferably 50 to 150 parts by weight, and still more preferably 70 to 120 parts by weight of the energy radiation polymerizable compound be used per 100 parts by weight of the acrylic pressure sensitive adhesive. In this instance, the initial adhesive strength of the obtained pressure sensitive adhesive sheet is large, and the adhesive strength is sharply decreased upon irradiation of the pressure sensitive adhesive layer with energy radiation. Accordingly, the peeling at the interface of the wafer and the energy radiation curable pressure sensitive adhesive layer to be performed after the completion of wafer back grinding is facilitated.

The energy radiation curable pressure sensitive adhesive may be composed of an energy radiation curable copolymer having an energy radiation polymerizable group as a side chain. This energy radiation curable copolymer simultaneously exhibits satisfactory adherence and energy radiation curability properties. Details of the energy radiation curable copolymer having an energy radiation polymerizable group as a side chain are described in, for example, Japanese Patent Laid-open Publication Nos. 5(1993)-32,946 and 8(1996)-27,239.

The time spent for photopolymerization and the photoirradiation dose can be reduced by mixing a photopolymerization initiator into the energy radiation curable pressure sensitive adhesive.

This photopolymerization initiator can be a photoinitiator such as a benzoin compound, an acetophenone compound, an acylphosphine oxide compound, a titanocene compound, a thioxanthone compound or a peroxide compound, or a photosensitizer such as an amine or a quinone. Specific examples thereof include 1-hydroxycyclohexyl phenyl ketone, benzoin, benzoin methyl ether, benzoin ethyl ether, benzoin isopropyl ether, benzyl diphenyl sulfide, tetramethylthiuram monosulfide, azobisisobutyronitrile, dibenzyl, diacetyl and β-chloroanthraquinone.

The photopolymerization initiator is preferably added in an amount of 0.05 to 15 parts by weight, still preferably 0.1 to 10 parts by weight, and optimally 0.5 to 5 parts by weight, to 100 parts by weight of the resin total.

The above acrylic energy radiation curable pressure sensitive adhesive possesses satisfactory adhesive strength to the wafer before irradiation with energy radiation, and the adhesive strength is extremely decreased upon irradiation with energy radiation. That is, the acrylic energy radiation curable pressure sensitive adhesive enables bonding the wafer with the pressure sensitive adhesive sheet with satisfactory adhesive strength to thereby attain a surface protection before irradiation with energy radiation, but after irradiation with energy radiation, enables easily stripping of the sheet from the ground wafer.

The elastic modulus at 23° C. of the intermediate layer is not greater than the elastic modulus at 23° C. of the pressure sensitive adhesive layer. Preferably, the elastic modulus at 23° C. of the intermediate layer is in the range of 1 to 100%, more preferably 10 to 90%, and still more preferably 30 to 80% of the elastic modulus at 23° C. of the pressure sensitive adhesive layer.

When the elastic moduli of the pressure sensitive adhesive layer and the intermediate layer at 23° C. satisfy the above relationship, not only can the sticking of the pressure sensitive adhesive sheet be effected in such a manner that the pressure sensitive adhesive sheet satisfactorily follows bump unevennesses, but also the shear force to the pressure sensitive adhesive layer is dispersed to thereby prevent the leaving behind of the pressure sensitive adhesive at the time of stripping. In other words, when the pressure sensitive adhesive sheet is stripped, the pressure sensitive adhesive is stripped along with the pressure sensitive sheet. Furthermore, the sticking can be effected so that there is no thickness difference between dense bump portions and sparse bump portions on the wafer surface.

The material composing the intermediate layer is not particularly limited as long as the above properties can be realized. For example, the material of the intermediate layer can be selected from among various pressure sensitive adhesive compositions such as those based on acrylics, rubbers and silicones, and thermoplastic elastomers and ultraviolet curable resins that can be employed in the preparation of a substrate as described later.

The intermediate layer is preferably composed of a material which exhibits a maximum value of tanδ of dynamic viscoelasticity (hereinafter referred to simply as "tanδ value") of at least 0.3, more preferably 0.4 to 2.0, and still more preferably 0.5 to 1.2, at a temperature ranging from 0 to 60° C. The term "tanδ" used herein represents the loss tangent which defines the ratio of loss elastic modulus to storage elastic modulus. For example, it is measured by the use of a dynamic viscoelasticity measuring instrument on the basis of response to a stress such as tension or torsion applied to an object.

The upper surface, i.e., the side on which the pressure sensitive adhesive layer is formed, of the intermediate layer may be provided with corona treatment or furnished with another layer such as a primer in order to increase the adherence to the pressure sensitive adhesive.

Although various films commonly used in pressure sensitive adhesive sheets can be employed without any particular limitation as the substrate, preferred use is made of films which exhibit a dynamic viscoelasticity "tanδ value" of at least 0.5, especially 0.5 to 2.0, and still more especially 0.7 to 1.8, at a temperature ranging from −5 to 80° C.

It is preferred that the multiplication product of the thickness and Young's modulus of the substrate be in the range of 0.5 to 100 kg/cm, especially 1.0 to 50 kg/cm, and still more especially 2.0 to 40 kg/cm.

When the multiplication product of the thickness and Young's modulus of the substrate falls within the above range, the mechanical aptitude, for example, sticking aptitude of the pressure sensitive adhesive sheet, is enhanced to thereby increase the work efficiency.

The substrate is preferably composed of a resin film. The substrate may be prepared by either molding a curable resin into a film and curing the film or by molding a thermoplastic resin.

For example, an energy radiation curable resin or a thermosetting resin is used as the curable resin. Preferably, an energy radiation curable resin is used.

The energy radiation curable resin is preferably selected from among, for example, resin compositions whose principal component is a photopolymerizable urethane acrylate oligomer and polyene/thiol resins.

This urethane acrylate oligomer can be obtained by reacting a polyester or polyether type polyol compound with a polyisocyanate compound such as 2,4-tolylene diisocyanate, 2,6-tolylene diisocyanate, 1,3-xylylene diisocyanate, 1,4-xylylene diisocyanate or diphenylmethane-4,4'-diisocyanate to thereby obtain an isocyanate-terminal urethane prepolymer and by reacting this isocyanate-terminal urethane prepolymer with a hydroxyl group containing acrylate or methacrylate such as 2-hydroxyethyl acrylate, 2-hydroxyethyl methacrylate, 2-hydroxypropyl acrylate, 2-hydroxypropyl methacrylate, polyethylene glycol acrylate or polyethylene glycol methacrylate. This urethane acrylate oligomer has a photopolymerizable double bond in its molecule and undergoes polymerization and curing when irradiated with light to thereby form a film.

The molecular weight of urethane acrylate oligomers preferably used in the present invention is in the range of 1000 to 50,000, especially 2000 to 30,000. These urethane acrylate oligomers can be used either individually or in combination.

It is often difficult to obtain a film only from the above urethane acrylate oligomers. Thus, films are generally obtained by diluting the urethane acrylate oligomer with a photopolymerizable monomer, conducting a film formation step and curing the film. The photopolymerizable monomer has a photopolymerizable double bond in its molecule and, in the present invention, it is preferred to use an acrylic ester compound having a relatively bulky group.

The photopolymerizable monomer employed for diluting the urethane acrylate oligomer is, for example, selected from among:

alicyclic compounds such as isobornyl (meth)acrylate, dicyclopentenyl (meth)acrylate, dicyclopentenyl (meth)acrylate, dicyclopentenyloxy (meth)acrylate, cyclohexyl (meth)acrylate and adamantane (meth)acrylate;

aromatic compounds such as phenylhydroxypropyl acrylate, benzyl acrylate and phenol ethylene oxide modified acrylate; and heterocyclic compounds such as tetrahydrofurfuryl (meth)acrylate, morpholinyl acrylate, N-vinylpyrrolidone and N-vinylcaprolactam. According to necessity, use may be made of polyfunctional (meth) acrylates.

The above photopolymerizable monomer is preferably added in an amount of 5 to 900 parts by weight, more preferably 10 to 500 parts by weight, and optimally 30 to 200 parts by weight, to 100 parts by weight of the urethane acrylate oligomer.

On the other hand, the photopolymerizable polyene/thiol resin for use in the production of the substrate is comprised of a polyene compound having no acryloyl group and a polythiol compound. Specifically, the polyene compound is selected from among, for example, diacrolein pentaerythritol, trimethylolpropane diallyl ether adduct of tolylene diisocyanate and unsaturated allylurethane oligomer. Mercaptoacetic acid or mercaptopropionic acid ester of pentaerythritol can preferably be used as the polythiol compound. Furthermore, use can be made of commercially available polyene polythiol oligomers. The molecular weight of the polyene/thiol resin for use in the present invention is preferably in the range of 3000 to 50,000, more preferably 5000 to 30,000.

In the forming of the substrate from the energy radiation curable resin, the time spent for photopolymerization and the photoirradiation dose can be reduced by mixing a photopolymerization initiator into the resin.

This photopolymerization initiator can be as aforementioned and is preferably added in an amount of 0.05 to 15 parts by weight, more preferably 0.1 to 10 parts by weight, and optimally 0.5 to 5 parts by weight, to 100 parts by weight of the resin total.

In the production of the above curable resin, oligomer and monomer can be selected from among various combinations so that the above properties can be realized.

The thermoplastic resin for preparing the substrate can be selected from among, for example, polyolefin resins such as polyethylene, polypropylene, polybutene, polybutadiene and polymethylpentene; and nonhydrogenated or hydrogenated styrene-vinylisoprene block copolymer. Of these, nonhydrogenated or hydrogenated styrene-vinylisoprene block copolymer is preferred.

The styrene-vinylisoprene block copolymer is generally a high vinyl bond SIS (styrene-isoprene-styrene block copolymer). Both the nonhydrogenated and hydrogenated styrene-vinylisoprene block copolymers per se exhibit a high peak of tanδ at about room temperature.

Additives capable of enhancing the tanδ value are preferably added to the above resin. Examples of the additives capable of enhancing the tanδ value include inorganic fillers such as calcium carbonate, silica and mica and metal fillers such as iron and lead. The addition of metal fillers having a high specific gravity is especially effective.

Further, the substrate may contain other additives, for example, colorants such as pigments and dyes in addition to the above components.

With respect to the film forming method, for example, the substrate can be produced by first casting a liquid resin (for example, precure resin or resin solution) onto a processing sheet in the form of a thin coating and subsequently conducting given steps for film formation. In this method, the stress loaded on the resin during the film formation is small, so that the occurrence of fish eye is reduced. Moreover, the uniformity of the film thickness is high and the thickness precision generally falls within 2%.

Another preferred method of forming a film comprises calendering or extrusion forming with the use of T die or inflation.

The pressure sensitive adhesive sheet of the present invention is produced by forming the pressure sensitive adhesive layer on the intermediate layer superimposed on the above substrate. When the pressure sensitive adhesive layer is composed of an ultraviolet curable pressure sensitive adhesive, the substrate and the intermediate layer must be transparent.

In the pressure sensitive adhesive sheet of the present invention, the thickness of the substrate is preferably in the range of 30 to 1000 µm, more preferably 50 to 800 µm, and optimally 80 to 500 µm.

The thickness of the intermediate layer is preferably in the range of 5 to 100 µm, more preferably 10 to 80 µm, and optimally 20 to 60 µm. Further, the thickness of the pressure sensitive adhesive layer, although depending on the type of material composing the same, is generally in the range of about 5 to 100 µm, preferably about 10 to 80 µm, and optimally about 20 to 60 µm.

The total thickness of the intermediate layer and the pressure sensitive adhesive layer is appropriately determined taking into account the bump height, bump configuration, bump interval pitch, etc. on an adherend to which the pressure sensitive adhesive sheet is stuck. It is generally preferred that the total thickness of the intermediate layer and the pressure sensitive adhesive layer be determined so as to be at least 50%, preferably 60 to 100%, of the bump height. When the total thickness of the intermediate layer and the pressure sensitive adhesive layer is so determined, the pressure sensitive adhesive sheet follows circuit surface unevennesses to thereby compensate for and cancel the height differences.

The pressure sensitive adhesive sheet of the present invention can be obtained by applying a resin which defines an intermediate layer onto a substrate; drying or curing the resin by appropriate means to thereby form the intermediate layer; coating the intermediate layer with the above pressure sensitive adhesive in appropriate thickness according to the customary technique employing a roll coater, a knife coater, a gravure coater, a die coater, a reverse coater or the like; and drying the pressure sensitive adhesive to thereby form a pressure sensitive adhesive layer on the intermediate layer. When considered necessary, a release liner is applied onto the pressure sensitive adhesive layer.

The second pressure sensitive adhesive sheet according to the present invention will now be described.

The second pressure sensitive adhesive sheet of the present invention comprises a substrate, an intermediate layer and a pressure sensitive adhesive layer arranged in this ordered array. Though various types of substrates and pressure sensitive adhesives can be used in the second pressure sensitive adhesive sheet, those embodiments explained for the first pressure sensitive adhesive sheet are preferably used.

The intermediate layer of the second pressure sensitive adhesive sheet exhibits an elastic modulus at 40° C. of less than $1.0 \times 10^6$ Pa, preferably $5.0 \times 10^3$ to $5.0 \times 10^5$ Pa, and more preferably $1.0 \times 10^4$ to $1.0 \times 10^5$ Pa.

When grinding the back of the semiconductor wafer, the temperature of the pressure sensitive adhesive sheet would be about 40° C. due to grinding heat. Therefore, the elastic modulus of the intermediate layer at this temperature is significant. That is, when the elastic modulus of the intermediate layer at 40° C. is within the above range, the pressure sensitive adhesive sheet precisely follows the unevenness of an adherend surface to compensate for the uneven height differences at the time of grinding the back of the adherend, to thereby achieve a smooth back grinding, free of thick difference without being affected by the unevenness of the adherend surface regardless of types of the substrate and pressure sensitive adhesive.

Preferred embodiments such as thickness, etc. of substrate, intermediate layer and pressure sensitive layer of the second pressure sensitive adhesive sheet are the same as those described above in connection with the first pressure sensitive adhesive sheet, and the production thereof is performed in the same manner as described with respect to the first pressure sensitive adhesive sheet.

The first and second pressure sensitive adhesive sheets of the present invention are used to protect the surface of various items and to effect temporary fixing thereof at the time of precision working. In particular, the pressure sensitive adhesive sheet is suitably used for protecting the circuit surface during the grinding of the back of semiconductor wafers. The pressure sensitive adhesive sheet of the present invention has the above-specified structure and hence effectively absorbs and compensates for the unevennesses of the circuit surface. Therefore, the pressure sensitive adhesive sheet of the present invention can not only be stuck with satisfactory adherence to wafers having large surface height differences because of bumps and the like but also mitigates against the influence of the unevennesses of the wafer surface to the back grinding to thereby enable accomplishing an extremely smooth grinding as well as prevention of the wafer breakage. Moreover, when the pressure sensitive adhesive layer is composed of, for example, an ultraviolet curable pressure sensitive adhesive, the adhesive strength thereof can be easily reduced by ultraviolet irradiation so that, after the completion of required working, the pressure sensitive adhesive layer can be easily stripped off by irradiating the pressure sensitive adhesive layer with ultraviolet rays.

Thus, the present invention provides a surface protective pressure sensitive adhesive sheet which can precisely follow the unevennesses of an adherend surface to thereby absorb and compensate for the height differences and which, at the time of grinding of the back of the adherend, enables achievement of a smooth back grinding free of thickness differences without being affected by the unevennesses of the adherend surface.

EXAMPLES

The present invention will further be illustrated below with reference to the following Examples which in no way limit the scope of the invention.

In the following Examples and Comparative Examples, the "back grinding aptitude test" was carried out in the following manner.

Back Grinding Aptitude Test

The following printed dotted bad marks as bumps were provided on a 6-inch mirror wafer. Each pressure sensitive adhesive sheet was stuck to the wafer surface provided with the bad mark, and the opposite surface of the wafer was ground. The wafer configuration, grinding conditions and evaluation method were as follows:

(1) Wafer configuration:
  wafer diameter: 6 inches,
  thickness of wafer (thickness of portion where no dot printing was made): 650 to 700 $\mu$m,
  dot diameter: 500 to 600 $\mu$m,
  dot height: 105 $\mu$m, and
  dot pitch: 2.0 mm interval (no printing was made up to 20 mm from the wafer circumference);

(2) Back grinding conditions:
  finish thickness: 200 $\mu$m, and
  grinding apparatus: grinder DFG 840 manufactured by Disco Corporation; and (3) Evaluation method:
(3.1) Dimples:
  Ground wafer back was observed. When there was no crack or dimple, the wafer was evaluated as "excellent". When dimples were observed but the maximum depth thereof was less than 2 $\mu$m, the wafer was evaluated as "good". On the other hand, when dimples were observed and the maximum depth thereof was 2 $\mu$m or more, the wafer was evaluated as "failure".
(3.2) Difference of wafer thickness:
  After the completion of back grinding, the pressure sensitive adhesive sheet was stripped from the wafer. The thickness was measured at 30 points, including those lying within 20 mm from the wafer circumference, of the wafer. The difference means the wafer thickness maximum minus the wafer thickness minimum.

The measuring was performed by the use of Dial Thickness Gauge (manufactured by Ozaki Mfg. Co., Ltd.).

tan$\delta$

The tan$\delta$ was measured by a dynamic viscoelasticity measuring instrument at a 110 Hz tensile stress. Specifically, each substrate was sampled into a given size, and the tan$\delta$ was measured at a frequency of 110 Hz and at temperatures ranging from −40 to 150° C. with the use of Rheovibron DDV-II-EP manufactured by Orientec Corporation. With respect to the substrate, the maximum value of measured tan$\delta$ at temperatures ranging from −5 to 80° C. was defined as "tan$\delta$ value". With respect to the intermediate layer, the maximum value of measured tan$\delta$ at temperatures ranging from 0 to 60° C. was defined as "tan$\delta$ value".

Young's Modulus

The Young's modulus was measured at a test speed of 200 mm/min in accordance with Japanese Industrial Standard (JIS) K7127.

Elastic Modulus

The elastic modulus G' of each of the pressure sensitive adhesive and the intermediate layer was measured by the torsional shear method, wherein,
  specimen: cylinder of 8 mm diameter×3 mm height,
  instrument: Dynamic Analyzer RDA II (manufactured by Reometric), and
  frequency: 1 Hz.

Example 1

50 parts by weight of urethane acrylate oligomer having a weight average molecular weight of 5000 (produced by Arakawa Chemical Industry Co., Ltd.), 25 parts by weight of isobornyl acrylate, 25 parts by weight of phenylhydroxypropyl acrylate, 2.0 parts by weight of 1-hydroxycyclohexyl phenyl ketone as a photopolymerization initiator (Irgacure 184 produced by Ciba-Geigy) and 0.2 part by weight of phthalocyanine pigment were blended together, thereby obtaining an energy radiation curable resin composition.

PET film (produced by Toray Industries, Inc., thickness: 38 $\mu$m) as a casting processing sheet was coated with the thus-obtained resin composition at a thickness of 110 $\mu$m according to the fountain die technique, thereby forming a resin composition layer. Immediately after the coating, the resin composition layer was laminated with the same PET film and thereafter irradiated with ultraviolet rays emitted from a high pressure mercury lamp (160 W/cm, height 10 cm) at a dose of 250 mJ/cm$^2$ so that the resin composition layer was crosslinked and cured. Thus, a substrate film of 110 $\mu$m thickness was obtained. The tan$\delta$ and Young's modulus of this substrate film were measured by the above methods. The results are given in Table 1.

A composition was prepared by blending together 60 parts by weight of urethane acrylate (produced by Toagosei Chemical Industry Co., Ltd.), 20 parts by weight of phenol ethylene oxide modified acrylate (trade name: M-101, produced by Toagosei Chemical Industry Co., Ltd.), 10 parts by weight of isobornyl acrylate and 2.0 parts by weight of photopolymerization initiator (Irgacure 184 produced by Ciba-Geigy), and cast on one side of the above substrate film according to the fountain die technique. Thus, an intermediate layer of 40 $\mu$m thickness was formed. The tan$\delta$ and Young's modulus of this intermediate layer were measured by the above methods. The results are given in Table 1.

A pressure sensitive adhesive composition was prepared by blending together 100 parts by weight of acrylic pressure sensitive adhesive (copolymer of n-butyl acrylate and acrylic acid), 120 parts by weight of urethane acrylate oligomer whose molecular weight was 8000, 10 parts by weight of curing agent (diisocyanate compound) and 5 parts by weight of photopolymerization initiator (benzophenone compound), applied onto the intermediate layer and dried so that a pressure sensitive adhesive layer of 20 μm thickness was formed. Thus, a pressure sensitive adhesive sheet was obtained.

The back grinding aptitude test of the obtained pressure sensitive adhesive sheet was conducted. The results are given in Table 1.

Example 2

The same procedure as in Example 1 was repeated except that a 20 μm thick intermediate layer was formed from a composition comprising 100 parts by weight of a copolymer of n-butyl acrylate and acrylic acid and 5 parts by weight of curing agent (diisocyanate compound) and that the thickness of the pressure sensitive adhesive layer was 40 μm. The results are given in Table 1.

Example 3

The same procedure as in Example 1 was repeated except that the substrate was formed by employing 50 parts by weight of isobornyl acrylate without using the phenylhydroxypropyl acrylate, that a 20 μm thick intermediate layer was formed from a composition comprising a mixture of 100 parts by weight of a copolymer of 2-ethylhexyl acrylate, vinyl acetate and acrylic acid and 5 parts by weight of epoxy curing agent (Tetrad C) and that a 40 μm pressure sensitive adhesive layer was formed from a composition comprising the acrylic pressure sensitive adhesive of Example 1 and 5 parts by weight of curing agent (diisocyanate compound). The results are given in Table 1.

Example 4

The same procedure as in Example 2 was repeated except that 110 μm thick low-density polyethylene film (trade name: Sumikathene L705) was used as a substrate film. The results are given in Table 1.

Comparative Example 1

The same procedure as in Example 1 was repeated except that no intermediate layer was formed. The results are given in Table 1.

Comparative Example 2

The same procedure as in Example 1 was repeated except that a 40 μm thick intermediate layer was formed by applying a composition comprising a mixture of 5 parts by weight of curing agent isocyanate and 100 parts by weight of an acrylic copolymer of 90 parts by weight of vinyl acetate, 8 parts by weight of methyl methacrylate and 2 parts by weight of acrylic acid, followed by drying. The results are given in Table 1.

Comparative Example 3

The same procedure as in Example 4 was repeated except that no intermediate layer was formed and that the thickness of the pressure sensitive adhesive layer was 20 μm. The results are given in Table 1.

Comparative Example 4

The same procedure as in Example 1 was repeated except that a 120 μm thick ethylene/vinyl acetate copolymer film (vinyl acetate content: 12%) was used as a substrate film, no intermediate layer was formed and a 10 μm thick pressure sensitive adhesive layer was formed from the same pressure sensitive adhesive as used in Example 1. The results are given in Table 1.

Comparative Example 5

The same procedure as in Example 1 was repeated except that a 100 μm thick polyethylene terephthalate film was used as a substrate film, no intermediate layer was formed and a 10 μm thick pressure sensitive adhesive layer was formed from the same pressure sensitive adhesive as used in Example 1. The results are given in Table 1.

TABLE 1

| | Substrate | | | Intermediate Layer | | | | Pressure Sensitive Adhesive | | | | Back Polishing Aptitude |
| --- | --- | --- | --- | --- | --- | --- | --- | --- | --- | --- | --- | --- |
| | tanδ | thickness (μm) | thickness × Young's modulus (kg/cm) | tanδ | thickness (μm) | elastic modulus (Pa) 23° C. | elastic modulus (Pa) 40° C. | thickness (μm) | elastic modulus (Pa) 23° C. | elastic modulus (Pa) 40° C. | dimple | difference of wafer thickness (μm) |
| Example 1 | 1.20 | 110 | 22.0 | 1.20 | 40 | $5.5 \times 10^4$ | $1.8 \times 10^4$ | 20 | $1.5 \times 10^5$ | $5.8 \times 10^4$ | excellent | 3.2 |
| Example 2 | 1.20 | 110 | 22.0 | 1.50 | 20 | $1.0 \times 10^5$ | $3.2 \times 10^5$ | 40 | $1.5 \times 10^5$ | $5.8 \times 10^4$ | excellent | 4.8 |
| Example 3 | 0.75 | 110 | 9.0 | 0.45 | 20 | $9.0 \times 10^4$ | $5.0 \times 10^4$ | 40 | $1.0 \times 10^5$ | $4.1 \times 10^4$ | excellent | 6.0 |
| Example 4 | 0.19 | 110 | 14.3 | 1.50 | 20 | $1.0 \times 10^5$ | $3.2 \times 10^5$ | 40 | $1.5 \times 10^5$ | $5.8 \times 10^4$ | good | 6.8 |
| Comp. Ex. 1 | 1.20 | 110 | 22.0 | | | | | 20 | $1.5 \times 10^5$ | | excellent | 59 |
| Comp. Ex. 2 | 1.20 | 110 | 22.0 | 0.5 | 40 | $3.0 \times 10^6$ | $1.7 \times 10^6$ | 20 | $1.5 \times 10^5$ | $5.8 \times 10^4$ | excellent | 37 |
| Comp. Ex. 3 | 0.19 | 110 | 14.3 | | | | | 20 | $1.5 \times 10^5$ | | failure | 72 |
| Comp. Ex. 4 | 0.17 | 120 | 6.6 | | | | | 10 | $1.5 \times 10^5$ | | failure | 66 |
| Comp. Ex. 5 | 0.03 | 100 | 350.0 | | | | | 10 | $1.5 \times 10^5$ | | failure | 73 |

While specific embodiments of the invention have been described in detail, it will be appreciated by those skilled in the art that various modifications and alternatives to those details could be developed in light of the overall teachings of the disclosure. The presently preferred embodiments described herein are meant to be illustrative only and not limiting as to the scope of the invention which is to be given the full breadth of the appended claims and any and all equivalents thereof.

The invention claimed is:

1. A pressure sensitive adhesive sheet comprising a substrate, an intermediate layer superimposed thereon and a pressure sensitive adhesive layer superimposed on the intermediate layer, said pressure sensitive adhesive layer exhibiting an elastic modulus at 23° C. ranging from $5.0 \times 10^4$ to $1.0 \times 10^7$ Pa, said intermediate layer exhibiting an elastic modulus at 23° C. which is not greater than the elastic modulus at 23° C. of the pressure sensitive adhesive layer.

2. The pressure sensitive adhesive sheet as claimed in claim 1, wherein the substrate exhibits a maximum value of tanδ of dynamic viscoelasticity of at least 0.5 at a temperature ranging from −5 to 80° C.

3. The pressure sensitive adhesive sheet as claimed in claim 1, wherein the substrate has a thickness and Young's modulus whose multiplication product is in the range of 0.5 to 100 kg/cm.

4. The pressure sensitive adhesive sheet as claimed in claim 2, wherein the substrate has a thickness and Young's modulus whose multiplication product is in the range of 0.5 to 100 kg/cm.

* * * * *